United States Patent
Yan et al.

(10) Patent No.: US 9,800,274 B2
(45) Date of Patent: Oct. 24, 2017

(54) COMMUNICATION UNITS AND METHODS FOR POWER SUPPLY CONTROL

(71) Applicant: MEDIATEK INC, Hsin-Chu (TW)

(72) Inventors: Sheng-Hong Yan, Tainan (TW); Chia-Sheng Peng, Taichung (TW); Paul Cheng Po Liang, Zhubei (TW)

(73) Assignee: MediaTek, Inc., Hsin-Chu (TW)

( * ) Notice: Subject to any disclaimer, the term of this patent is extended or adjusted under 35 U.S.C. 154(b) by 0 days.

(21) Appl. No.: 15/177,113

(22) Filed: Jun. 8, 2016

(65) Prior Publication Data

US 2017/0005676 A1 Jan. 5, 2017

Related U.S. Application Data

(60) Provisional application No. 62/188,500, filed on Jul. 3, 2015.

(51) Int. Cl.
| | |
|---|---|
| *H04L 25/49* | (2006.01) |
| *H04B 1/04* | (2006.01) |
| *H04W 52/52* | (2009.01) |
| *H03F 1/02* | (2006.01) |
| *H03F 3/24* | (2006.01) |
| *H03F 3/189* | (2006.01) |
| *H04L 27/36* | (2006.01) |

(52) U.S. Cl.
CPC ......... *H04B 1/0475* (2013.01); *H03F 1/0227* (2013.01); *H03F 3/189* (2013.01); *H03F 3/24* (2013.01); *H04W 52/52* (2013.01); *H03F 2200/102* (2013.01); *H03F 2200/451* (2013.01); *H03F 2200/511* (2013.01); *H04B 2001/0425* (2013.01); *H04L 27/367* (2013.01)

(58) Field of Classification Search
CPC .......... H03F 1/3247; H03F 1/025; H03F 3/68; H04L 27/368
USPC ............. 375/297, 298; 330/124 R, 127, 297; 455/127, 574
See application file for complete search history.

(56) References Cited

U.S. PATENT DOCUMENTS

| | | | |
|---|---|---|---|
| 6,788,151 B2 | 9/2004 | Shvarts et al. | |
| 7,091,772 B2 | 8/2006 | Friedel et al. | |
| 8,824,978 B2 | 9/2014 | Briffa et al. | |
| 8,829,993 B2 | 9/2014 | Briffa et al. | |
| 2014/0118063 A1* | 5/2014 | Briffa .................... | H03F 1/32 330/124 R |
| 2014/0120854 A1* | 5/2014 | Briffa .................. | H03G 3/3042 455/127.3 |
| 2014/0274227 A1* | 9/2014 | Drogi ................ | H04W 52/0238 455/574 |

OTHER PUBLICATIONS

"High-efficiency power amplifier using novel dynamic bias switching" Young-Sang Jeon, Member, IEEE, Jukyung Cha, and Sangwook Nam, Member, IEEE.

* cited by examiner

*Primary Examiner* — Khai Tran
(74) *Attorney, Agent, or Firm* — Optimus Patents US, LLC

(57) ABSTRACT

A communication unit comprises a decimator configured to sample a variable control signal and output a reduced bandwidth variable control signal; and a multi-level power supply, MLPS, comprising an input and an output, wherein the input is coupled to the decimator and configured to receive the reduced bandwidth variable control signal and, in response thereto, the output delivers multi-level output voltages to supply a power amplifier, PA, module.

21 Claims, 7 Drawing Sheets

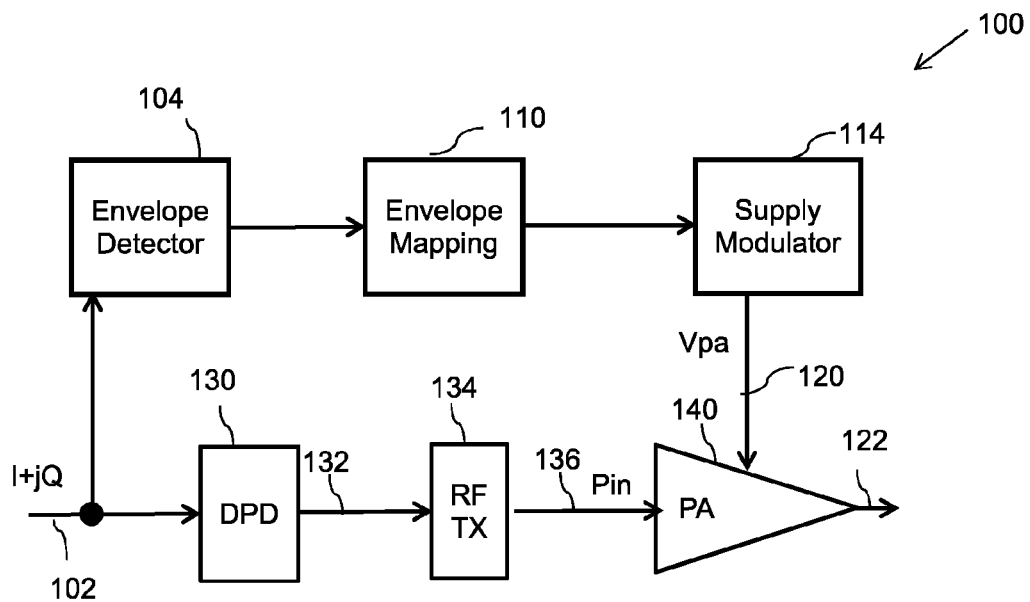
FIG. 1 – Prior Art
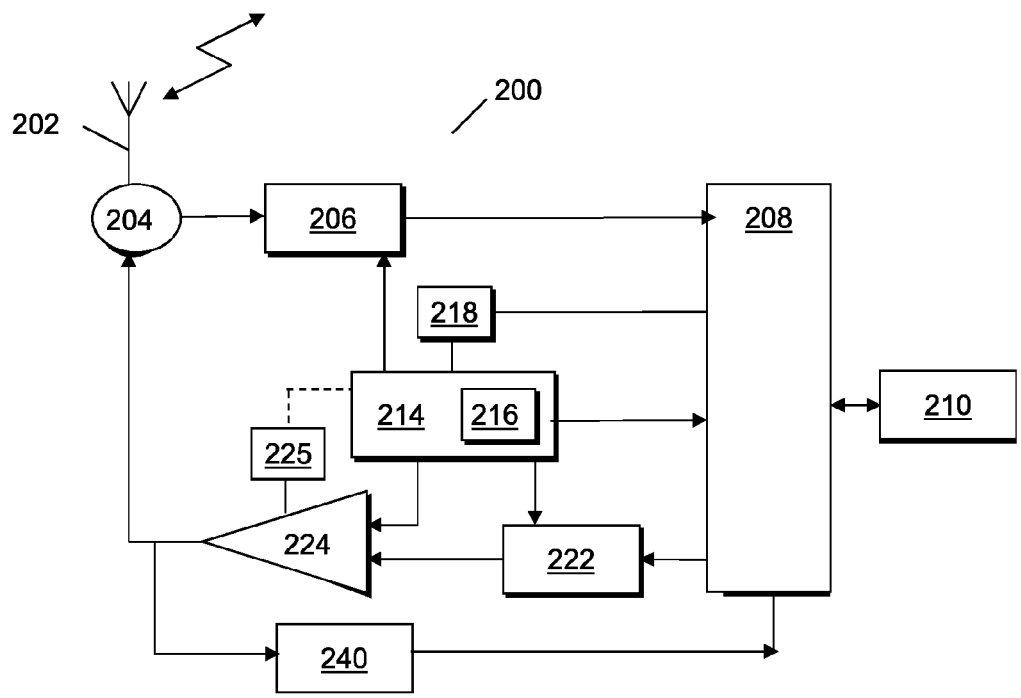
FIG. 2

COMMUNICATION UNITS AND METHODS FOR POWER SUPPLY CONTROL

FIELD OF THE INVENTION

The field of this invention relates to methods and apparatus for power supply control, and in particular to methods and apparatus for improving efficiency of a power amplifier module, for example within a radio frequency (RF) transmitter employing an envelope tracking system of a wireless communication unit.

BACKGROUND OF THE INVENTION

A primary focus and application of the present invention is the field of radio frequency (RF) power amplifiers capable of use in wireless telecommunication applications. Continuing pressure on the limited spectrum available for radio communication systems is forcing the development of spectrally-efficient linear modulation schemes. Since the envelopes of a number of these linear modulation schemes fluctuate, these result in the average power delivered to the antenna being significantly lower than the maximum possible power, leading to poor efficiency of the power amplifier. Specifically, in this field, there has been a significant amount of research effort in developing high-power efficient topologies capable of providing useful performance in the 'back-off' (linear) region of the power amplifier.

Linear modulation schemes require linear amplification of the modulated signal in order to minimise undesired out-of-band emissions from spectral re-growth. However, the active devices used within a typical RF power amplifier are inherently non-linear by nature. Only when a small portion of the consumed direct current (DC) power is transformed into RF power, can the transfer function of the amplifying device be approximated by a straight line, i.e. as in an ideal linear amplifier. This mode of operation provides a low efficiency of DC to RF power conversion, which is unacceptable for portable (subscriber) wireless communication units. Furthermore, low efficiency is also increasingly being recognised as being problematic for base stations.

Additionally, the emphasis in portable (subscriber) equipment is to increase battery life. To achieve both linearity and efficiency, so called linearisation techniques are used to improve the linearity of the more efficient amplifier classes, for example class 'AB', 'B' or 'C' amplifiers. A number and variety of linearising techniques exist, such as Cartesian Feedback, Feed-forward, and Adaptive Pre-distortion, which are often used when designing linear transmitters.

Voltages at the output of the linear, e.g. Class AB, amplifier are typically dictated by the requirements of the final RF power amplifier (PA) device. Generally, the minimum supply voltage of the PA is significantly larger than that required by the output devices of the Class AB amplifier. Hence, they are not the most efficient of amplification techniques. The efficiency of the transmitter (primarily the PA) is determined by the voltage across the output devices, as well as any excess voltage across any pull-down device components due to the minimum supply voltage (Vmin) requirement of the PA.

In order to increase the bit rate used in transmit uplink communication channels, larger constellation modulation schemes, with an amplitude modulation (AM) component are being investigated and, indeed, becoming required. These modulation schemes, such as sixteen-bit quadrature amplitude modulation (16-QAM), require linear PAs and are associated with high 'crest' factors (i.e. a degree of fluctuation) of the modulation envelope waveform. This is in contrast to the previously often-used constant envelope modulation schemes and can result in significant reduction in power efficiency and linearity.

To help overcome such efficiency and linearity issues a number of solutions have been proposed.

To raise efficiency of a transmitter that uses a linear PA, the linear PA is supplied with a time-varying voltage that tracks an envelope of a signal to be transmitted, typically referred to as 'envelope tracking'. A known supply voltage technique 100 is to combine envelope tracking (ET) with digital pre-distortion (DPD), as illustrated in FIG. 1. FIG. 1 illustrates modulating the radio frequency (RF) power amplifier (PA) supply voltage (Vpa) 120 to match (e.g. track) the envelope of the radio frequency waveform being transmitted by the RF PA 140. Careful control of the supply voltage helps in maximizing PA efficiency for each PA output power, in that the closer to this value the supply voltage is, the higher PA efficiency is. Typically, ET systems control the RF PA supply voltage 120 in order to improve PA efficiency through selecting a lower supply voltage dependent upon an instantaneous envelope of the input signal, and to improve linearity by selecting a RF PA supply voltage 120 dependent upon a constant PA amplification gain.

In the illustrated supply voltage technique 100, control/manipulation of the input waveform/signal in the digital domain is performed in order to compensate for PA nonlinearity (AM-to-AM and AM-to-PM) effects, thereby improving PA output linearity based on prior information or measured data of the PA system. A digital (quadrature) input signal 102 is input to a digital pre-distortion (DPD) function 130. The DPD function 130 pre-distorts the input digital signal, such that the non-linear effects subsequently caused by the PA 140 can be pre-compensated. The output 132 from the DPD function 130 is input to RF transmitter 134, whose output provides an input power level 136 to the RF PA 140. The RF PA output 122 is typically output to an antenna and/or matching circuit.

Concurrently, the digital (quadrature) input signal 102 is applied to an envelope detector 104 arranged to determine a real-time envelope of the signal to be transmitted (e.g. radiated). The determined real-time envelope signal output from the envelope detector 104 is input to an envelope mapping function 110, which is arranged to determine a suitable PA supply voltage (Vpa) 120 to be applied to the PA 140 to substantially match the instantaneous real-time envelope of the signal to be transmitted. The output from the envelope mapping function 110 is input to a supply modulator 114 that provides the PA supply voltage (Vpa) 120 to be applied to the PA 140.

With ET, the instantaneous PA supply voltage (Vpa) 120 of the wireless transmitter is caused to approximately track the instantaneous envelope (ENV) of the transmitted RF signal. Thus, since the power dissipation in the PA 140 is proportional to the difference between its supply voltage and output voltage, ET may provide an increase in PA efficiency, reduced heat dissipation, improved linearity and increased maximum output power 122, whilst allowing the PA to produce the intended RF output. However, the total system efficiency is affected by supply modulator efficiency, which is related to the supply modulator design, supply voltage range, bandwidth and PA loading. As the envelope bandwidth becomes wider, a supply modulator that uses a linear amplifier to fulfill the bandwidth requirement is less efficient. This typically results in the ET modulator efficiency not being high enough for most applications.

U.S. Pat. No. 6,788,151 B2 describes a variable output power supply for use in a linear amplification system.

There exists a need for a more efficient and cost effective solution to improve PA efficiency, particularly for wider bandwidth applications.

SUMMARY OF THE INVENTION

Accordingly, the invention seeks to mitigate, alleviate or eliminate one or more of the above mentioned disadvantages singly or in any combination.

According to a first aspect of the invention, there is provided a communication unit comprising a decimator configured to sample a variable control signal and output a reduced bandwidth variable control signal; and a multi-level power supply, MLPS, comprising an input and an output, wherein the input is coupled to the decimator and configured to receive the reduced bandwidth variable control signal and, in response thereto, the output delivers multi-level output voltages to supply a power amplifier, PA, module.

In this manner, a transmitter architecture is described, for example one that uses a switch-mode envelope tracking system, which can raise efficiency of the PA system for wider bandwidth applications by reducing a bandwidth of a control signal used to select a supply voltage output from a MLPS to supply the PA module.

In an optional example embodiment, the MLPS may be configured to select an output supply voltage for the PA module from a plurality of sets of available output voltages, based at least partly on the reduced bandwidth variable control signal output from the decimator.

In an optional example embodiment, the decimator may be configured to dynamically adapt a sampling rate applied to the variable control signal to reduce a control signal bandwidth, for example to thereby increase an efficiency of the PA module through an improved, selectable adaptable supply voltage output from the MLPS. In some examples, a controller may be operably coupled to the decimator and configured to dynamically select and inform the decimator of at least one decimation factor to be applied by the decimator in order to adapt the sampling rate applied to the variable control signal.

In an optional example embodiment, the transmitter may comprise a digital pre-distortion, DPD, circuit arranged to receive and distort an input transmit signal, output the distorted transmit signal to an RF transmit circuit to amplify and up-convert the distorted transmit signal and apply the amplified, up-converted distorted transmit signal to the PA module, wherein the power controller is operably coupled to and arranged to set power levels in the RF transmit circuit and DPD circuit. In some examples, a portion of the reduced bandwidth variable control signal output from the decimator may be input to the DPD circuit such that the DPD circuit distorts the input transmit signal to compensate for PA non-linearity at least partly based on the reduced bandwidth variable control signal. In this manner, as PA non-linearity depends on both its input signal and supply voltage, the DPD circuit is able to better compensate PA non-linearity when both sets of information are used than it does when only an input signal is used.

In an optional example embodiment, the decimator may be configured to sample the received variable control signal using at least one decimation factor, to thereby form a plurality of subsets of samples, and select a sample from the plurality of subsets of samples of a sample sequence as an output reduced bandwidth variable control signal wherein a location of the selected sample from the sample sequence is not fixed and is dependent upon one or more other sample values within a decimated subset. In some examples, the decimator may be configured to select a maximum sample value from each decimated subset as an output reduced bandwidth variable control signal. In some examples, the decimator may be configured to output the control signal at a 1/DF rate of an input signal.

In an optional example embodiment, a decimation factor may be selected based at least partly on an efficiency measurement of the communication unit. In some examples, successive iterative efficiency measurement of the communication unit may be made with the decimation factor selected based at least partly on a decimation factor providing the best efficiency.

In an optional example embodiment, the communication unit may comprise an envelope detector configured to detect an envelope of a signal to be transmitted by the PA module and output the detected ET signal to the decimator as the variable control signal. In some examples, the transmitter may further comprise a quantizer configured to apply quantization threshold values to the detected ET signal and output a quantized detected ET signal to the decimator.

According to a second aspect of the invention, there is provided a method for providing a power supply to a power amplifier, PA, module in a transmitter configured to convert digital signals into radio frequency, RF, signals. The method comprises: configuring multi-level output voltages in a multi-level power supply, MLPS, to be provided to the PA module; receiving a variable control signal; applying decimation by sampling the variable control signal and outputting a reduced bandwidth variable control signal; receiving the decimated reduced bandwidth variable control signal at the MLPS, and delivering multi-level output voltages by the MLPS to a supply of the PA module based on at least the decimated reduced bandwidth variable control signal.

According to a third aspect of the invention, there is provided a communication unit comprising; an adaptive quantizer comprising: an input configured to receive an input signal; a control input configured to receive quantization threshold adaptation information; a quantizer configured to adaptively change one or more quantization threshold values applied to the received input signal in response to the received quantization threshold adaptation information and generate a quantized variable control signal; and an output configured to output the quantized variable control signal. A multi-level power supply, MLPS, comprises an input and an output, where the input is configured to receive the quantized variable control signal and, in response thereto, the output delivers multi-level output voltages to a supply of the PA module.

In this manner, a transmitter architecture is described, for example one that uses a switch-mode envelope tracking system, which can raise efficiency of the PA system for wider bandwidth applications by the adaptive quantizer applying different quantization thresholds to a variable control signal to select a supply voltage output from a MLPS to supply the PA module, whilst maintaining good adjacent channel leakage ratio (ACLR) performance.

In an optional example embodiment, the MLPS may be configured to select an output supply voltage to be applied to the PA module from a set of available multi-level output voltages based at least partly on the quantized variable control signal output from the adaptive quantizer.

In an optional example embodiment, the communication unit may further comprise a transmit power control, TPC, circuit coupled to the MLPS and the adaptive quantizer and configured to select at least one quantization threshold level to be applied to the input signal based on the target PA output power. In some examples, the TPC circuit may be configured to determine required levels of supply voltages to be applied to the PA module by the MLPS and send quantization threshold values to the adaptive quantizer, for the adaptive quantizer to apply to the input signal.

In an optional example embodiment, the communication unit may comprise an envelope detector configured to detect an envelope of a signal to be transmitted by the PA module and output the detected ET signal as the input signal for the adaptive quantizer. In some examples, the adaptive quantizer is configured to quantize the detected ET signal to generate the quantized variable control signal according to a set of quantization threshold levels.

In an optional example embodiment, the communication unit may further comprise a digital pre-distortion, DPD, circuit configured to receive and distort an input transmit signal, output the distorted transmit signal; an RF transmit circuit configured to amplify and up-convert the distorted transmit signal and apply the amplified, up-converted distorted transmit signal to the PA module; wherein the DPD circuit is configured to distort the input transmit signal to compensate for PA non-linearity, partly based on the control signal output from the adaptive quantizer. In some examples, a portion of the quantized variable control signal is output from the adaptive quantizer to the DPD circuit such that the DPD circuit distorts the input transmit signal to compensate for PA non-linearity at least partly based on the quantized variable control signal output from the adaptive quantizer.

In an optional example embodiment, the quantization threshold may be selected based at least partly on: an efficiency measurement of the transmitter, a linearity measurement of the transmitter, a system noise measurement of the transmitter. In some examples, successive measurements of efficiency, linearity and system noise of the transmitter may be made and the quantization threshold is selected based at least partly on a quantization threshold providing a better efficiency linearity and system noise than other quantization thresholds for a given output power level.

According to a fourth aspect of the invention, there is provided a method for providing a power supply to a power amplifier, PA, module in a transmitter configured to convert digital signals into radio frequency, RF, signals. The method comprises: configuring multi-level output voltages in a multi-level power supply, MLPS, to be provided to the PA module; receiving a variable control signal; receiving quantization threshold adaptation information; adaptively changing one or more quantization threshold values in an adaptive quantizer; applying the adapted one or more quantization threshold values applied to the received input signal in response to the received quantization threshold adaptation information and generate a quantized variable control signal; and delivering multi-level output voltages by the MLPS to a supply of the PA module based on at least the quantized variable control signal.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the FIGs are illustrated for simplicity and clarity and have not necessarily been drawn to scale.

FIG. 1 illustrates a known block diagram architecture of an envelope tracking (ET) and digital pre-distortion (DPD) technique.

FIG. 2 illustrates a simplified generic block diagram of an example of a communication unit.

DETAILED DESCRIPTION OF THE INVENTION

Figure 3:
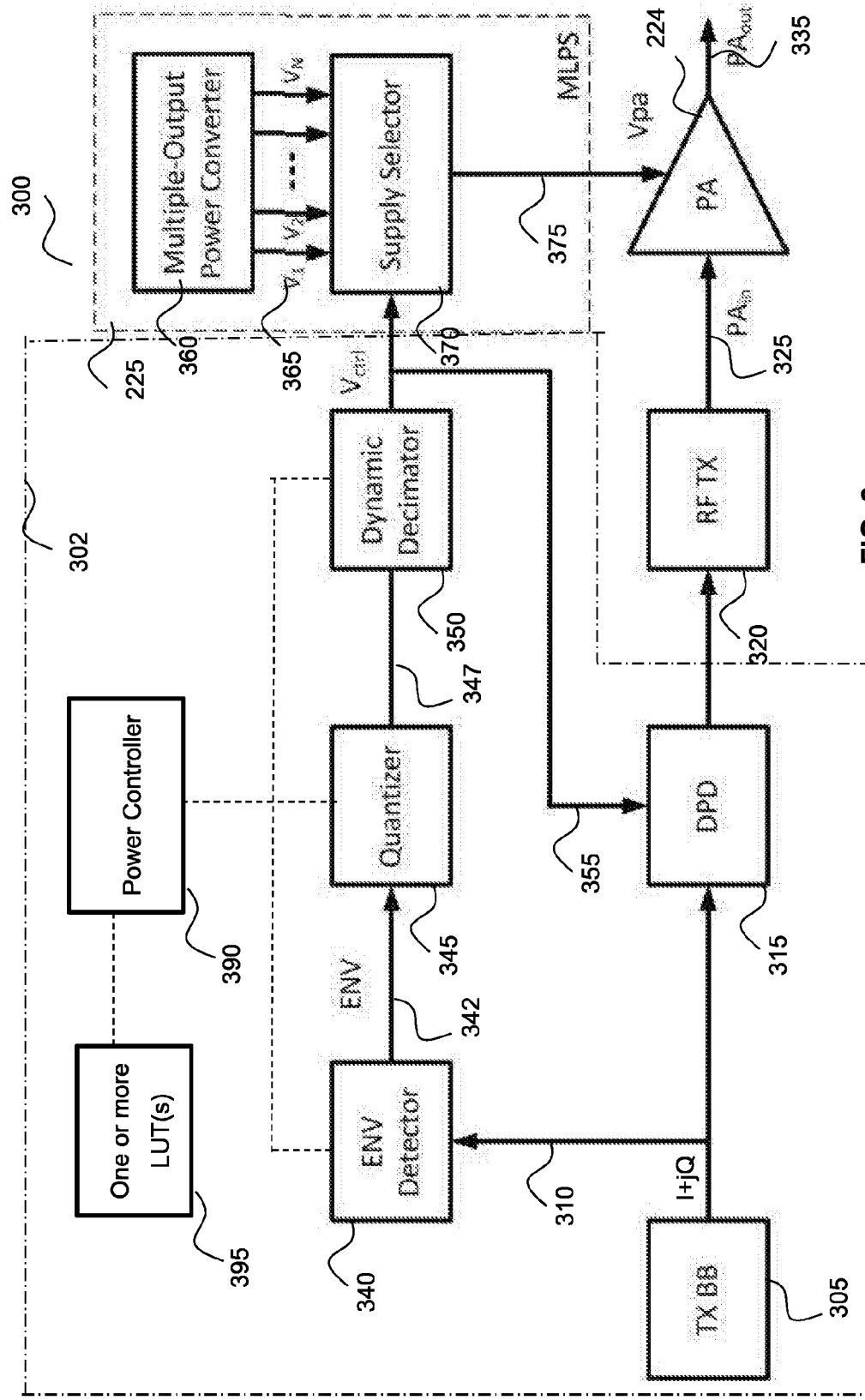
FIG. 3 illustrates a first example block diagram of an envelope tracking (ET) and digital pre-distortion (DPD) architecture that is adapted to include a quantizer and dynamic decimator in accordance with some examples of the invention.

Examples of the invention will be described in terms of one or more integrated circuits for use in a wireless communication unit, such as user equipment in Long Term Evolved (LTE™) parlance, as well as a wireless transmitter that comprises or forms a part of an envelope tracking system. Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Examples of the invention will be described in terms of switch-mode envelope tracking (ET), as this is a good candidate for transmitters whose signal is wideband and exhibits a high peak-to-average power ratio (PAPR), such as LTE uplink inter-band CA and WiFi 11ac, and improves supply modulator efficiency, thus reducing the transmitter power consumption. The term 'switch-mode' is used herein to encompass voltage levels being delivered to a PA supply port covering several discrete levels, where the PA supply voltages are switched among these levels.

Examples of the invention will also be described in terms of a multi-level power supply (MLPS), in contrast to a supply modulator that uses a linear amplifier, in order to fulfill the bandwidth requirement, as MLPS exhibits better efficiency, thereby resulting in better PA system efficiency. Examples of the invention will also be described in terms of an ET architecture that employs a digital pre-distorter (DPD) to address linearity requirements of the transmitted output spectrum. Examples of the invention will also be described in terms of an ET architecture that employs a DPD in combination with one or more of: a TPC processor, a quantizer, such as an adaptive quantizer employing modifiable quantization threshold levels to convert an envelope signal to a MLPS control signal based on PA target output power, and a dynamic decimator.

In accordance with some examples of the invention, the inventors have recognized and appreciated that the operating efficiency of an ET architecture is dependent upon both the Power Amplifier (PA) efficiency as well as the envelope tracking modulator (ETM) efficiency, substantially in accordance with:

$$\text{Operating efficiency} = \text{PA efficiency} \times \text{ETM efficiency} \quad [1]$$

In particular, the inventors have recognized and appreciated that the ETM efficiency drops as the bandwidth of the signals that are being amplified increases. Therefore, as the applications for linear amplifier techniques are requiring ever increasing higher bandwidths there is a need for a highly-efficient supply modulator, particularly for wider bandwidth applications.

Some examples propose a transmitter architecture employing a decimator, for example one that uses a switch-mode envelope tracking system, which can raise efficiency of the PA system for wider bandwidth applications by the decimator being configured to reduce a bandwidth of a control signal used to select a supply voltage output from a MLPS to supply the PA module. Some examples propose a transmitter architecture employing an adaptive quantizer, that uses a switch-mode envelope tracking system that can raise efficiency of the PA system for wider bandwidth applications by the adaptive quantizer applying different quantization thresholds to a variable control signal used to select a supply voltage output from a MLPS to supply the PA module, whilst maintaining good adjacent channel leakage ratio (ACLR) performance.

Referring first to FIG. 2, a block diagram of a wireless communication unit 200 (sometimes referred to as a mobile subscriber unit (MS) in the context of cellular communications or a user equipment (UE) in terms of a 4th generation Long Term Evolved (LTE™) communication system) is shown, in accordance with one example embodiment of the invention. The wireless communication unit 200 contains an antenna 202 preferably coupled to a duplex filter or antenna switch 204 that provides isolation between receive and transmit chains within the wireless communication unit 200.

The receiver chain, as known in the art, includes receiver front-end circuitry 206 (effectively providing reception, filtering and intermediate or base-band frequency conversion). The front-end circuitry 206 is coupled to a signal processor 208. An output from the signal processor 208 is provided to a suitable user interface 210, which may encompass a screen or flat panel display and a keyboard. A controller 214 maintains overall subscriber unit control and is coupled to the receiver front-end circuitry 206 and the signal processor 208 (generally realised by a digital signal processor (DSP)). The controller 214 is also coupled to a memory 216 that selectively stores various operating regimes, such as decoding/encoding functions, synchronisation patterns, code sequences, and the like.

In accordance with examples of the invention, the memory 216 stores modulation data, and power supply data for use in supply voltage control to track the envelope of the radio frequency waveform to be radiated by the wireless communication unit 200. Furthermore, a timer 218 is operably coupled to the controller 214 to control the timing of operations (transmission or reception of time-dependent signals and, in a transmit sense, the time domain variation of the PA supply voltage within the wireless communication unit 200).

As regards the transmit chain, this includes the user interface 210, coupled in series via the signal processor 208 to transmitter/modulation circuitry 222. The transmitter/modulation circuitry 222 processes input signals for transmission and modulates and up-converts these signals to a radio frequency (RF) signal for amplifying in the power amplifier module or integrated circuit 224. RF signals amplified by the PA module (or PA integrated circuit) 224 are passed to the antenna 202. The transmitter/modulation circuitry 222, power amplifier module 224 and PA supply voltage modulator 225 are each operationally responsive to the controller 214, with the PA supply voltage modulator 225 additionally responding to a reproduction of the envelope modulated waveform from the transmitter/modulation circuitry 222. In this manner, a PA supply voltage modulator 225 is arranged to modulate the supply voltage to the PA 224 in accordance with the envelope modulated waveform, thereby performing envelope tracking modulation of the supply voltage provided to the PA 224.

According to some example embodiments of the invention, the signal processor 208 in a transmit path comprises: a digital pre-distortion, DPD, module or function arranged to receive and distort an input transmit signal. The DPD may receive a control signal and/or a fed back portion of a signal 240 output from the PA 224 in order to determine optimal settings for pre-distortion components to use to pre-distort the input baseband transmit signal. The pre-distorted transmit signal output from the DPD is input to transmitter/modulation circuitry 222 to amplify and up-convert the distorted transmit signal and apply the amplified, up-converted distorted transmit signal to the PA module (or PA integrated circuit) 224.

According to some example embodiments of the invention, the transmitter comprises an envelope tracking system, which in turn comprises: an envelope detector (not shown) arranged to detect an instantaneous envelope of the input transmit signal, and an arrangement coupled to a supply modulator configured to set a supply voltage level to the PA module (or PA integrated circuit) 224 based on the detected envelope.

In some examples, the controller 214 may be operably coupled and arranged to set levels within each of: a DPD module, the transmitter/modulation circuitry 222, any envelope to supply mapping circuits (not shown), etc. In this manner, the controller 214 may be able to individually set and optimise the performance of each of a DPD, one or more RF transmitter circuit and an ET system, thereby concurrently improving efficiency and linearity. In some examples, the controller 214 may receive feedback from a variety of measurements at various points in the RF transmitter, in order to fine tune the above settings and optimising performance of the various circuits. Some of these measurements may entail one or more of: power, voltage, current, phase, latency, PA load, etc.

Furthermore, in accordance with examples of the invention, the transmitter/modulation circuitry 222, together with power amplifier 224, PA supply voltage modulator 225, memory 216, timer function 218 and controller 214 have been adapted to generate a power supply to be applied to the PA 224. For example, a power supply is generated that is suitable for multi-level power supply (MLPS), and in some examples configured to track the envelope waveform applied to the PA 224.

FIG. 3 illustrates a first example block diagram of an ET and DPD architecture 300 that is adapted to include a quantizer and dynamic decimator in a multi-level power supply (MLPS) control signal path, in accordance with some examples of the invention. This first example block diagram of an ET and DPD architecture 300 may be employed in the communication unit 200 of FIG. 2.

In this first example block diagram of an ET and DPD architecture 300, a transmit baseband (Tx BB) signal is generated in a Tx BB processor 305. The Tx BB signal, for example in a form of a digital I/Q input signal 310, is provided to an envelope detector 340 operable to receive the digital I/Q input signal 310 and calculate an envelope value 342 therefrom, for example by extracting a portion of the envelope of the signal to be transmitted by PA module 224. Further, the envelope detector 340 may be operably coupled to an envelope mapping module (not shown), which may provide a mapping value from the calculated envelope value to a power amplifier supply voltage modulator (sometimes referred to as an ET modulator). In this example, the envelope mapping module is a quantizer 345 that is configured to convert its envelope input signal into control signal 347 based on quantization threshold values that are set within the variable quantizer 345.

In this example, the quantizer 345 outputs the variable control signal 347 to a dynamic decimator 350, configured to reduce the sampling rate of the variable control signal 347 in order to thereby increase efficiency of a supply selector of power amplifier supply voltage modulator 225. In some examples, dynamic decimator 350 takes Decimation Factor (DF) samples of the received variable control signal 347 into a buffer (not shown) and selects the maximum sample in the buffer as an output. This output (355) is clocked at 1/DF rate of the input signals. The next DF samples are then taken into the buffer and the process repeated.

In this example, the power amplifier supply voltage modulator 225 is a multi-level power supply (MLPS) configured to generate a PA supply voltage (Vpa) 375 with a large current, in order to create a target output power level from the PA 224. In this example, the MLPS comprises a supply selector 370 and an efficient multiple-output power converter 360, where the set of available output voltages 365 may be configured at fabrication. In this example, a supply voltage from the set of available output voltages 365 is selected by supply selector 370 based at least partly on the variable control signal 355 from the dynamic decimator 350.

In order to address the linearity requirements of the transmitter, digital I/Q input signal 310 may also be input to DPD circuit 315. DPD circuit 315 receives a control signal in order to adjust the baseband (digital) signals to compensate for, say, AM-AM and/or AM-PM distortion that will be introduced by PA module 224. Thus, in this example, DPD circuit 315 distorts the Tx BB signal to compensate for any PA non-linearity based, at least partly, on the quantized variable control signal output of the adaptive quantizer 345. DPD circuit 315 receives a sample of the transmit PA output signal 335 (not shown) to determine the effect of the DPD compensation. The digitally pre-distorted output from the DPD circuit 315 is input to a radio frequency transmit (RF TX) circuit 320 that is configured to convert digital signal into RF signals 325 to be input to the PA module 224. In some examples, RF TX circuit 320 may comprise, for example a digital low pass filter, variable gain amplifier, mixer and frequency synthesiser, RF bandpass filter, etc. (not shown).

The selected supply 375 is provided to the PA module 224, which amplifies the radio frequency (RF) input signal 325 to the target power 335. In this manner, utilising envelope tracking to control the output power of the PA module 224, the efficiency of the PA module 224 may be improved.

In some examples, a detection feedback path (not shown) carrying transmit output signal 335 may be calibrated, in order to provide accurate power measurements. As a consequence, one or more lookup tables (LUTs) 395 of values may be created containing, say, for each desired output power range, corresponding settings for baseband, transmitter/modulation circuitry, PA gain, envelope mapping, DPD values, quantizer thresholds, dynamic decimator values, etc. Thus, in one example, each desired PA output power, once calibrated, may be associated with a particular LUT value.

In some examples, a power controller 390 may be provided to obtain measurements from any component or circuit in the transmitter and accordingly provide control signals to the component or circuit to optimise parameters used thereby or therein to optimise the component or circuit performance. The power controller 390 may be coupled to the one or more lookup tables (LUTs) 395 to obtain values of parameters to be used to optimise the component or circuit performance. For example, the power controller 390 may optimise the component or circuit performance for one or more of: baseband, transmitter/modulation circuitry, PA gain, envelope mapping, DPD values, quantizer thresholds, dynamic decimator values, etc.

A known decimator function will select and use only a fixed subset from a number of samples that are taken, with the selection being every nth sample. For example, an original sequence could be: {s1, s2, s3, s4, s5, s6, s7, s8, s9}, which after decimation using a decimation factor (DF)=3, the sample sequence to use would become, say, {s1, s4, s7}.

However, in contrast to known decimator operations, examples of the present invention propose a new dynamic decimator. In some examples, the dynamic decimator advantageously selects an optimal sample from a subset of samples. For example, an original sequence could be: {s1, s2, s3, s4, s5, s6, s7, s8, s9}, which after dynamic decimation using a decimation factor (DF)=3, may become {s1, s6, s8} where a maximum value from a first subset ({s1, s2, s3})=s1, a maximum value from a second subset ({s4, s5, s6})=s6, and a maximum value from third subset ({s7, s8, s9})=s8. Thus, in some examples, a location of the sample to be kept and used following decimation may be dependent upon the other preceding (DF−1) samples and/or other sample values within the decimated subset.

Furthermore, the illustrated example in FIG. 3 may be implemented as circuitry located in a single integrated circuit or multiple integrated circuits within the same device. Alternatively, the illustrated examples may be implemented as any number of separate integrated circuits (for example a predominantly digital circuit, a predominantly power supply circuit, a RF circuit, a PA module 224, etc.) or separate devices interconnected with each other in a suitable manner. For example, in FIG. 3, integrated circuit 302 may comprise one or more of the predominantly digital circuits. In some examples, the integrated circuit 302 may comprise: an output port coupleable to a power amplifier, PA, module 224; an output port coupleable to a multi-level power supply, MLPS, comprising an input and an output. An input is configured to receive a variable control signal and, in response thereto, the output delivers multi-level output voltages to a supply of the PA module, based on a target PA output power. The dynamic decimator 350 is coupled to the input of the MLPS 225 and configured to sample the variable control signal and output a reduced bandwidth variable control signal to the MLPS 225.

Figure 4:
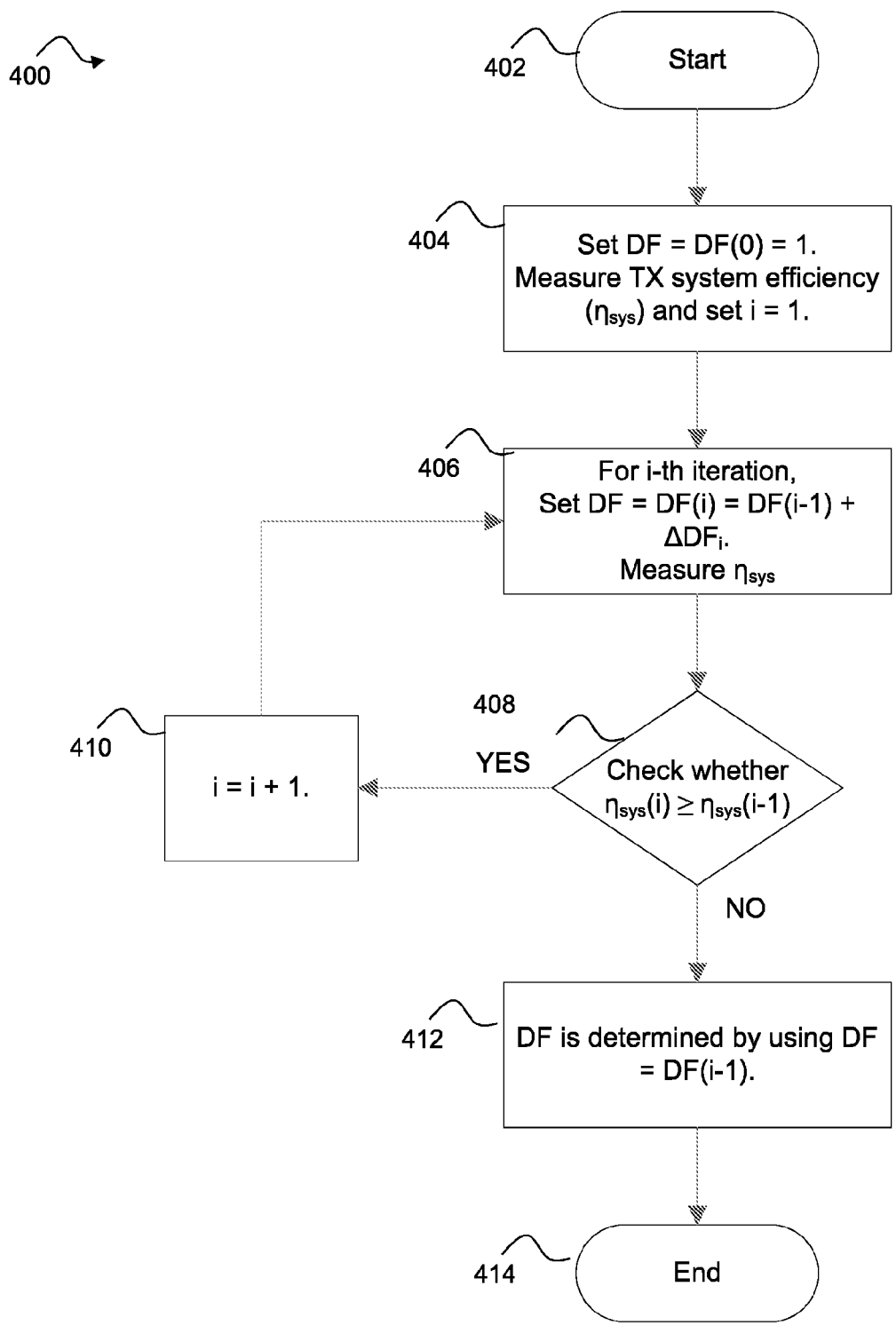
FIG. 4 illustrates an example flowchart of a dynamic decimator operation, for example within an ET and DPD architecture, in accordance with some examples of the invention.
Figure 5:
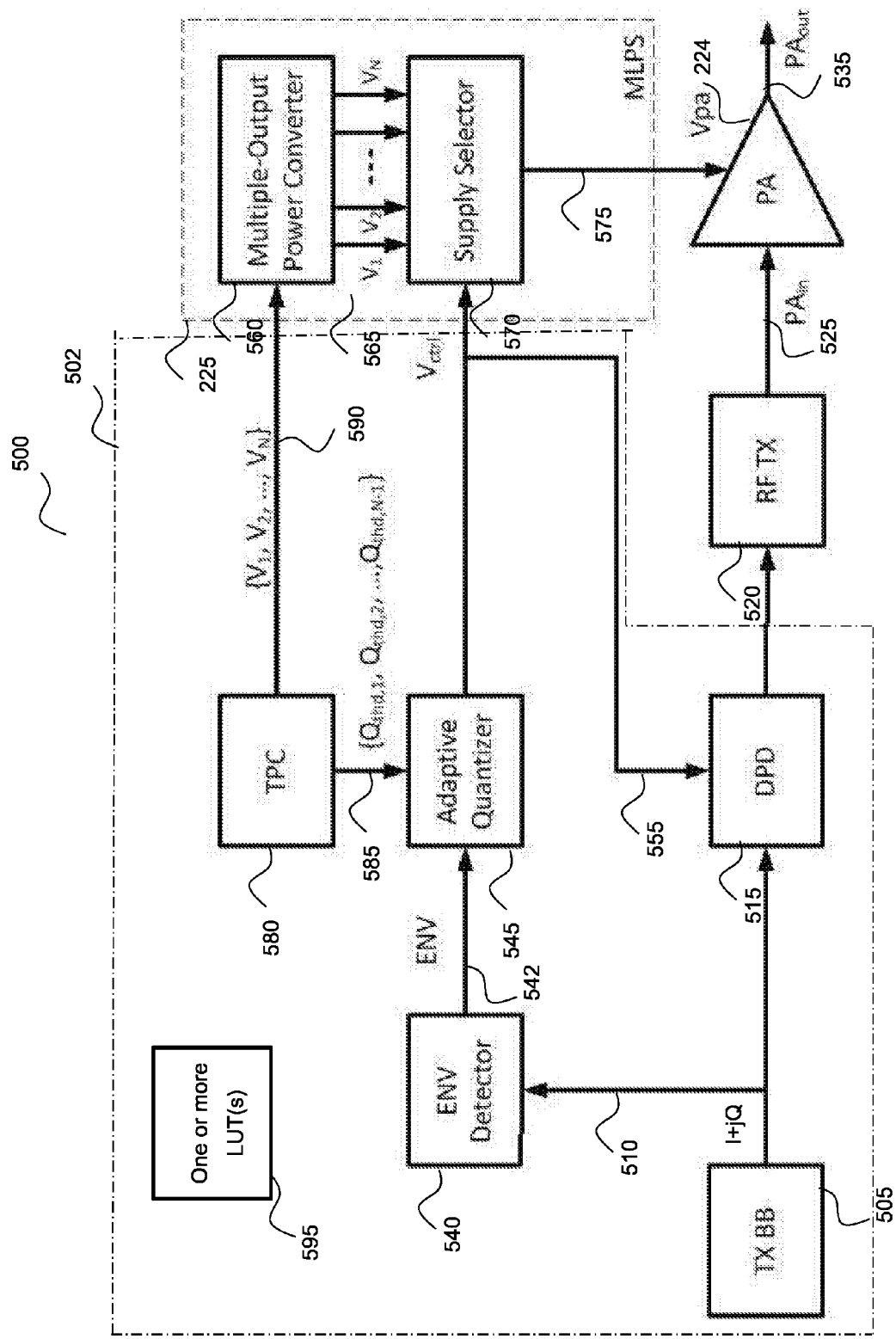
FIG. 5 illustrates a second example block diagram of an ET and DPD architecture that is adapted to include transmit power control (TPC) and a quantizer, in accordance with some examples of the invention.
Figure 6:
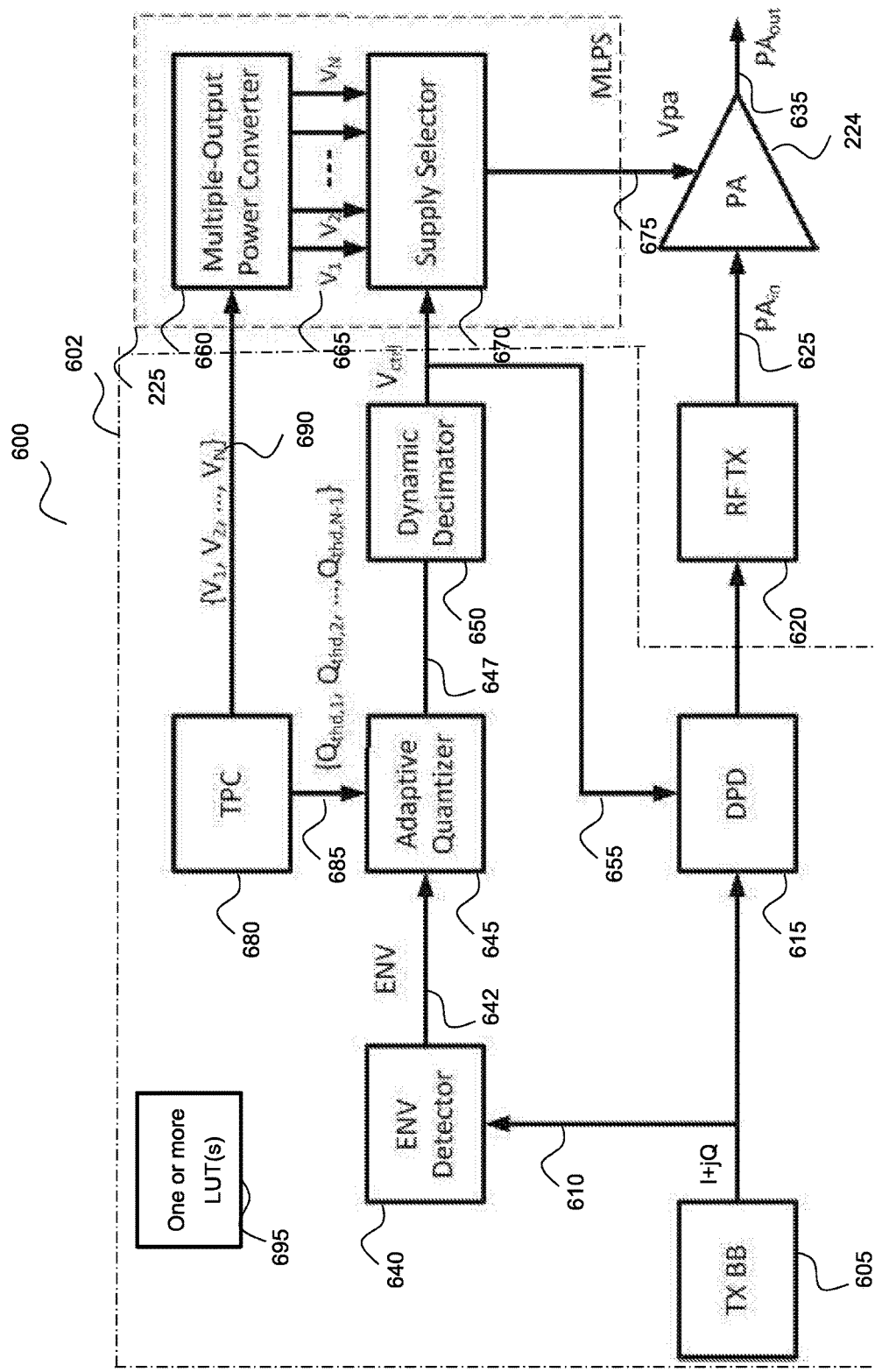
FIG. 6 illustrates a third example block diagram of an ET and DPD architecture that is adapted to include a TPC, a quantizer and a dynamic decimator in accordance with some examples of the invention.

FIG. 4 illustrates a flowchart 400 of a dynamic decimator operation within an ET and DPD architecture, such as the architectures of any of FIG. 3, FIG. 5 or FIG. 6, in accordance with some examples of the invention. Although the flowchart is described with reference to measuring transmitter system efficiency, it is envisaged that other examples of the invention may use any, or a combination, of: transmitter system efficiency, transmitter system linearity (Lsys), transmitter system noise level (Nsys), are then measured in, with any one or more of these measurements capable of being used for a decision. The flowchart 400 starts at 402. A decimation counter ('i') for a first decimation factor (DF) is set to a value of '1' and the transmit system efficiency measured at 404. The decimation flowchart then enters an iterative loop 406, 408, 410, in order to determine the optimal decimation factor to use. The iterative loop comprises, for the i-th iteration, the DF being set to the previous DF plus the delta value, and the transmit system efficiency measured in 406. A determination as to whether the transmit system efficiency measured in 406 is greater than or equal to the previously measured transmit system efficiency is made at 408. If, at 408, the transmit system efficiency measured in 406 is greater than or equal to the previously measured transmit system efficiency, the iterative process continues and 'i' is incremented at 410 and the process loops to 406 for the next transmit system efficiency measure. If, at 408, the transmit system efficiency measured in 406 is not greater than or equal to the previously measured transmit system efficiency, the iterative process ends and the optimal DF is selected at 412 by selecting the DF relating to the previously measured transmit system efficiency, i.e. DF=DF(i−1). The decimator operation then finishes at 414.

In this manner, the example dynamic decimator operation of FIG. 4 may be employed to identify different decimation factors for use with different PAs in order to achieve an improved performance, e.g. the best ET system efficiency when including a PA and ETM.

FIG. 5 illustrates a second example block diagram of an ET and DPD architecture 500 that is adapted to include transmit power control (TPC) and an adaptive quantizer, in accordance with some examples of the invention. This second example block diagram of an ET and DPD architecture 500 may be employed in the communication unit 200 of FIG. 2.

In this second example block diagram of an ET and DPD architecture 500, a transmit baseband (BB) signal is generated in a transmit BB processor 505. The transmit BB signal, for example in a form of a digital I/Q input signal 510, is provided to an envelope detector 540 operable to receive the digital I/Q input signal 510 and calculate an envelope value 542 therefrom, for example by extracting a portion of the envelope of the signal to be transmitted by PA module 224. Further, in this illustrated example, the envelope detector 540 may be operably coupled to an envelope mapping module (not shown), which may provide a mapping value from the calculated envelope value to a power amplifier supply voltage modulator 225 (sometimes referred to as an ET modulator). In this example, the envelope mapping module is an adaptive quantizer 545 that is configured to convert its envelope input signal into a variable control signal 555 based on quantization threshold values that are set within the variable quantizer 545. The variable control signal 555 is output to a supply selector 570 of a power amplifier supply voltage modulator 225.

In this example, the power amplifier supply voltage modulator 225 is a multi-level power supply (MLPS) configured to generate a PA supply voltage (Vpa) 575 with a large current, in order to create a target output power level from the PA 224. In this example, the MLPS comprises a supply selector 570 and an efficient multiple-output power converter 560, where the set of available output voltages 565 is configured at fabrication. In this example, a supply voltage from the set of available output voltages 565 may be selected by supply selector 570 based at least partly on the variable control signal 555 from the adaptive quantizer 545. In this example, control signal 555 input to the supply selector 570 of MLPS is based on the quantization threshold values 585, which are adaptively adjusted by transmit power control (TPC) processor 580. According to a desired PA target output power, the TPC processor 580 determines the required levels of supply voltages 590 that need to be set for the MLPS and also sends quantization threshold values 585 to the adaptive quantizer 545, to be used when quantizing the envelope value 542 of the input signal 510 to generate the variable control signal 555.

In examples of the invention, the term 'sets', for example with respect to multi-level output voltages in a multi-level power supply (MLPS), encompasses any set or range or sequence of PA supply voltages (Vpa) 590, such as ($V_1$, $V_2$, ..., $V_N$), where, during operation, the voltage levels ($V_1$, $V_2$, ..., $V_N$) can be changed. Similarly, in examples of the invention, a quantizer threshold set is one example of $\{Q_{thd,1}, Q_{thd,2}, ..., Q_{thd,N-1}\}$ of quantization threshold values 585.

In order to address the linearity requirements of the transmitter, digital I/Q input signal 510 may also be input to DPD circuit 515. DPD circuit 515 receives a further control signal (not shown) to adjust the baseband (digital) signals to compensate for AM-AM and/or AM-PM distortion that will be introduced by PA module 224. Thus, in this example, DPD circuit 515 distorts the transmit BB signal to compensate for any PA non-linearity, partly based on the variable control signal 555 output from adaptive quantizer 545. The digitally pre-distorted output from the DPD circuit 515 is input to a radio frequency transmit (RF transmit) circuit 520 that is configured to convert digital signal into RF signals 525 to be input to the PA module 224. In some examples, RF transmit circuit 520 may comprise, for example a digital low pass filter, variable gain amplifier, mixer and frequency synthesiser, RF bandpass filter, etc. (not shown).

The selected supply 575 is provided to the PA module 224, which amplifies the radio frequency (RF) input signal 525 to the target power 535. In this manner, utilising envelope tracking to control the output power of the PA module 224, the efficiency of the PA 224 may be improved.

Furthermore, the illustrated example in FIG. 5 may be implemented as circuitry located in a single integrated circuit or multiple integrated circuits within the same device. Alternatively, the illustrated examples may be implemented as any number of separate integrated circuits (for example a predominantly digital circuit, a predominantly power supply circuit, a RF circuit, a PA module 224, etc.) or separate devices interconnected with each other in a suitable manner. For example, in FIG. 5, integrated circuit 502 may comprise one or more of the predominantly digital circuits. The integrated circuit 502 comprises: an output port coupleable to a power amplifier, PA, module; an output port coupleable to a multi-level power supply, MLPS, comprising an input and an output, wherein the input is configured to receive a variable control signal and, in response thereto, the output delivers multi-level output voltages to a supply of the PA module. Adaptive quantizer 545 comprises: an input configured to receive an input signal; a control input configured to receive quantization threshold adaptation information based on the target PA output power; a quantizer configured to adaptively change one or more quantization threshold values applied to the received input signal in response to the received quantization threshold adaptation information and generate a quantized variable control signal; and an output configured to output the quantized variable control signal to the MLPS 225.

Again, in some examples, a detection feedback path (not shown) carrying transmit output signal 535 may be calibrated, in order to provide accurate power measurements. As a consequence, one or more lookup tables (LUTs) 595 of values may be created containing, say, for each desired output power range, corresponding settings of: baseband, transmitter/modulation circuitry, PA gain, envelope mapping, DPD values, quantizer thresholds, etc. Thus, in one example, each desired PA output power, once calibrated, may be associated with a particular LUT value. Although not shown, a power controller similar to power control 390 of FIG. 3 may also be used to measure and control parameters of components or circuits in the transmitter.

FIG. 6 illustrates a third example block diagram of an ET and DPD architecture 600 that is adapted to include a TPC, an adaptive quantizer and a dynamic decimator in accordance with some examples of the invention. This third example block diagram of an ET and DPD architecture 600 may be employed in the communication unit 200 of FIG. 2.

In this third example block diagram of an ET and DPD architecture 600, a transmit baseband (Tx BB) signal is generated in a Tx BB processor 605. The Tx BB signal, for example in a form of a digital I/Q input signal 610, is provided to an envelope detector 640 operable to receive the digital I/Q input signal 610 and calculate an envelope value 642 therefrom, for example by extracting a portion of the envelope of the signal to be transmitted by PA module 224. Further, in this illustrated example, the envelope detector 640 may be operably coupled to an envelope mapping module (not shown), which may provide a mapping value from the calculated envelope value to a power amplifier supply voltage modulator (sometimes referred to as an ET modulator). In this example, the envelope mapping module may be an adaptive quantizer 645 that is configured to convert its envelope input signal 642 into variable control signal 647 based on quantization threshold values that are set within the variable quantizer 645.

In this example, the adaptive quantizer 645 outputs the variable control signal 647 to a dynamic decimator 650 configured to reduce the sampling rate of the variable control signal 647 in order to increase efficiency of a supply selector of power amplifier supply voltage modulator 225. The dynamic decimator 650 takes Decimation Factor (DF) samples of the received variable control signal 647 into a buffer (not shown) and selects, say, a maximum sample in the buffer as an output. This variable output control signal 655 may be clocked at 1/DF rate of the input signals. The next DF samples are taken into the buffer and the process then repeated. The variable control signal 655 is output to a supply selector 670 of a power amplifier supply voltage modulator 225.

In this example, the power amplifier supply voltage modulator 225 is a multi-level power supply (MLPS) configured to generate a PA supply voltage (Vpa) 675 with a large current, in order to create a target output power level from the PA module 224. In this example, the MLPS comprises a supply selector 670 and an efficient multiple-output power converter 660, where the set of available output voltages 665 may be configured at fabrication. In this example, a supply voltage from the set of available output voltages 665 may be selected by supply selector 670 based at least partly on the control signal 655 from the adaptive quantizer 645. In this example, control signal 655 input to the supply selector 670 of MLPS is based on the quantization threshold values 685, which are adaptively adjusted by transmit power control (TPC) processor 680. According to a desired PA target output power, the TPC processor 680 determines the required levels of supply voltages 690 that need to be set for the MLPS and also sends quantization threshold values 685 to the adaptive quantizer 645.

In order to address the linearity requirements of the transmitter, digital I/Q input signal 610 may also be input to DPD circuit 615. DPD circuit 615 receives a further control signal (not shown) to adjust the baseband (digital) signals to compensate for AM-AM and/or AM-PM distortion that will be introduced by PA module 224. Thus, in this example, DPD circuit 615 distorts the TX BB signal to compensate for any PA non-linearity, partly based on the variable control signal 655 output from adaptive quantizer 645. The digitally pre-distorted output from the DPD circuit 615 is input to a radio frequency transmit (RF TX) circuit 620 that is configured to convert digital signal into RF signals 625 to be input to the PA module 224. In some examples, RF TX circuit 620 may comprise, for example a digital low pass filter, variable gain amplifier, mixer and frequency synthesiser RF bandpass filter, etc. (not shown).

The selected supply 675 is provided to the PA module 224, which amplifies the radio frequency (RF) input signal 625 to the target power 635. In this manner, utilising envelope tracking to control the output power of the PA module 224, the efficiency of the PA module 224 may be improved.

Again, the illustrated example in FIG. 6 may be implemented as circuitry located in a single integrated circuit or multiple integrated circuits within the same device. Alternatively, the illustrated examples may be implemented as any number of separate integrated circuits (for example a predominantly digital circuit, a predominantly power supply circuit, a RF circuit, a PA module 224, etc.) or separate devices interconnected with each other in a suitable manner. For example, in FIG. 6, integrated circuit 602 may comprise one or more of the predominantly digital circuits.

Again, in some examples, a detection feedback path (not shown) carrying transmit output signal 635 may be calibrated, in order to provide accurate power measurements. As a consequence, one or more lookup tables (LUTs) 695 of values may be created containing, say, for each desired output power range, corresponding settings of baseband, transmitter/modulation circuitry, PA gain, envelope mapping, DPD values, quantizer thresholds, dynamic decimator values, etc. In one example, each desired PA output power, once calibrated, may be associated with a particular LUT value.

In one example, an input signal to at least one power amplifier module output power may be power swept through a range of values to produce an output power list for the at least one power amplifier module across a range of input signal levels. Thus, in some examples, a plurality of power amplifier characteristics, e.g. PA gain levels for a plurality of power amplifier modules may be obtained. The determined mapping values obtained may be stored, for example, in an 'envelope-to-supply' look up table (LUT) 695. In this illustrated example, each power amplifier output in the desired list may comprise its own LUTs, delay values, etc., after calibration. In this manner, it is possible to sweep input (and therefore output) power values across a number of power amplifier modules and across to set up appropriate LUTs with the required values.

Figure 7:
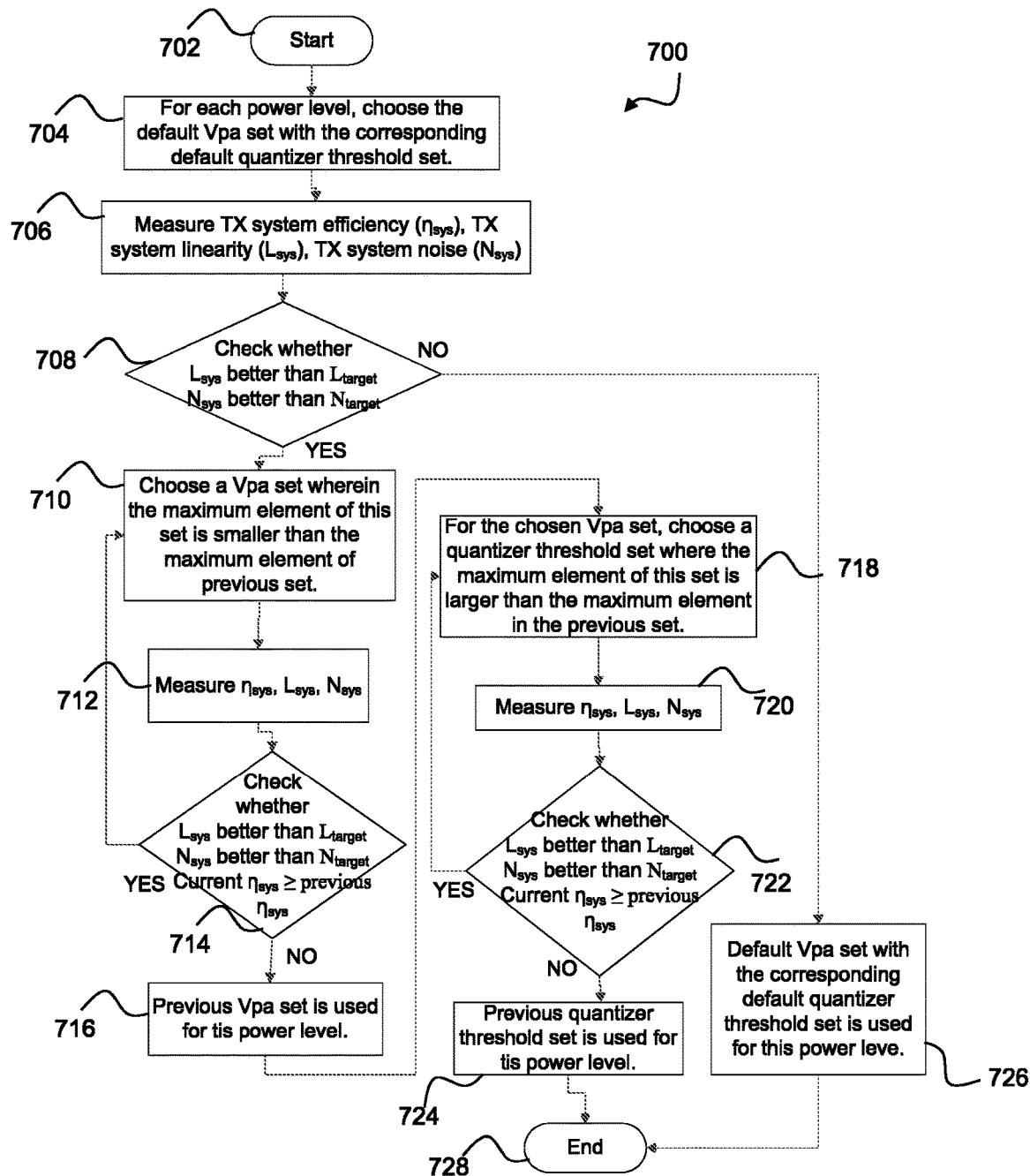
FIG. 7 illustrates an example flowchart of an adaptive quantizer operation within an ET and DPD architecture, in accordance with some examples of the invention.

FIG. 7 illustrates an example flowchart 700 of an adaptive quantizer operation within an ET and DPD architecture in accordance with some examples of the invention. In some examples, a default PA supply voltage (Vpa) set with a corresponding default quantizer threshold set can be formed following laboratory experiments to ensure a transmitter is programmed to perform with the best linearity and/or best noise performance, based on varying prevailing conditions. The flowchart 700 starts at 702 and then, for each output power level, a default PA supply voltage (Vpa) is set together with a corresponding default quantizer threshold set, as in 704. In some examples, these values may be determined in PA module fabrication, or from vendors' datasheets. A number of parameters, such as the transmitter system efficiency, the transmitter system linearity (Lsys) and the transmitter system noise level (Nsys), are then measured in 706, with any one or more of these measurements capable of being used for a decision.

In some examples, Lsys may be application-dependent. For example, adjacent channel leakage ratio (ACLR) may be used for LTE™, whilst a spectrum mask may be used to assess the noise level for WiFi™. Furthermore, in some examples, Nsys may also be application-dependent and specified in application or technology Standards.

A determination is then made, in 708, as to whether the transmitter system linearity is better than a target transmitter system linearity (Ltarget), e.g. better than a transmitter system linearity threshold, and whether the transmitter system noise level is better than a target transmitter system noise level (Ntarget), e.g. better than a transmitter system noise level threshold. In some examples, the Ltarget and Ntarget are implementation specifications, which may be set by a user or system designer.

If the determination in 708 is that the transmitter system linearity is not better than a target transmitter system linearity, and that the transmitter system noise level is not better than a target transmitter system noise level, a default PA supply voltage (Vpa) is set with a corresponding default quantizer threshold for that power level at 726.

If, however, the determination in 708 is that the transmitter system linearity is better than a target transmitter system linearity, and that the transmitter system noise level is better than a target transmitter system noise level, a PA supply voltage (Vpa) set is selected where the maximum element of the set is smaller than the maximum element of a previous set considered, in 710. At 712, a number of parameters, such as the transmitter system efficiency, the transmitter system linearity and the transmitter system noise level, are measured again.

At 714, a determination is again made as to whether the transmitter system linearity is better than a target transmitter system linearity, and/or whether the transmitter system noise level is better than a target transmitter system noise level and/or whether the current transmitter system efficiency is better than (or equal to) the previous transmitter system efficiency. If the determination in 714 is that the transmitter system linearity is better than a target transmitter system linearity, and/or the transmitter system noise level is better than a target transmitter system noise level and/or that the current transmitter system efficiency is better than (or equal to) the previous transmitter system efficiency, then the system is iteratively improving and the process loops to 710. If, however, the transmitter system linearity is not better than a target transmitter system linearity, and/or the transmitter system noise level is not better than a target transmitter system noise level and/or the current transmitter system efficiency is not better than (or equal to) the previous transmitter system efficiency, then the previous power supply voltage (Vpa) set is used for that power level in 716.

A similar iterative loop is then employed for the quantizer threshold set. For the selected Vpa set, a quantizer threshold is set where the maximum element of this set is larger than the maximum element in the previous set, in 718, for example where the maximum element is the maximum value from the set, such as the maximum element of Vpa set $\{V_1, V_2, \ldots, V_N\}$ may be $V_1$, or $V_2$, or others. At 720, a number of parameters, such as the transmitter system efficiency, the transmitter system linearity and the transmitter system noise level, are measured again. At 722, a determination is again made as to whether the transmitter system linearity is better than a target transmitter system linearity, and/or whether the transmitter system noise level is better than a target transmitter system noise level and/or whether the current transmitter system efficiency is better than (or equal to) the previous transmitter system efficiency. If the determination in 722 is that the transmitter system linearity is better than a target transmitter system linearity, and/or the transmitter system noise level is better than a target transmitter system noise level and/or that the current transmitter system efficiency is better than (or equal to) the previous transmitter system efficiency, then the system is iteratively improving and the process loops to 718. If, however, the transmitter system linearity is not better than a target transmitter system linearity, and/or the transmitter system noise level is not better than a target transmitter system noise level and/or the current transmitter system efficiency is not better than (or equal to) the previous transmitter system efficiency in 722, then the previous quantizer threshold set is used for that power level in 724. The process then ends at 728.

Figure 8:
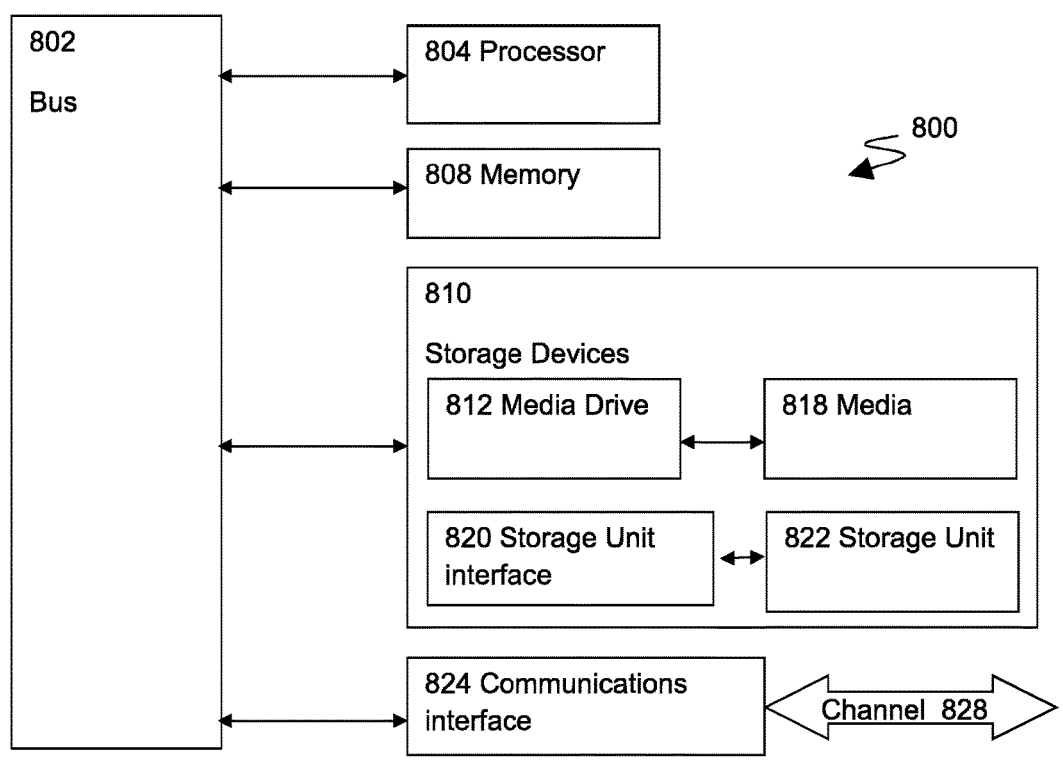
FIG. 8 illustrates a simplified example of a typical computing system that may be employed to implement signal processor in embodiments of the invention.

Referring now to FIG. 8, there is illustrated a typical computing system 800 that may be employed to implement software-controlled power control functionality in embodiments of the invention that utilize envelope tracking and load control. Computing systems of this type may be used in wireless communication units, such as subscriber units or base stations (sometimes referred to as eNodeBs in LTE™ parlance). Those skilled in the relevant art will also recognize how to implement the invention using other computer systems or architectures. For example, computing system 800 may represent, for example, a desktop, laptop or notebook computer, hand-held computing device (PDA, cell phone, palmtop, etc.), or any other type of special or general purpose computing device as may be desirable or appropriate for a given application or environment. Computing system 800 can include one or more processors, such as a processor 804. Processor 804 can be implemented using a general or special-purpose processing engine such as, for example, a microprocessor, microcontroller or other control logic. In this example, processor 804 (or controller) is connected to a bus 802 or other communications medium.

Computing system 800 can also include a main memory 808, such as random access memory (RAM) or other dynamic memory, for storing information and instructions to be executed by processor 804. Main memory 808 also may be used for storing temporary variables or other intermediate information during execution of instructions to be executed by processor 804. Computing system 800 may likewise include a read only memory (ROM) or other static storage device coupled to bus 802 for storing static information and instructions for processor 804.

In some examples, computing system 800 may be operable to implement various software programs to control one or more of: an adaptive quantizer, a dynamic decimator, a MLPS, a TPC, a DPD circuit, etc. in a calibration phase and/or in a transmission state.

The computing system 800 may also include information storage system 810, which may include, for example, a media drive 812 and a removable storage interface 820. The media drive 812 may include a drive or other mechanism to support fixed or removable storage media, such as a hard disk drive, a floppy disk drive, a magnetic tape drive, an optical disk drive, a compact disc (CD) or digital video drive (DVD) read or write drive (R or RW), or other removable or fixed media drive. Storage media 818 may include, for example, a hard disk, floppy disk, magnetic tape, optical disk, CD or DVD, or other fixed or removable medium that is read by and written to by media drive 812. As these examples illustrate, the storage media 818 may include a computer-readable storage medium having particular computer software or data stored therein.

In alternative embodiments, information storage system 810 may include other similar components for allowing computer programs or other instructions or data to be loaded into computing system 800. Such components may include, for example, a removable storage unit 822 and an interface 820, such as a program cartridge and cartridge interface, a removable memory (for example, a flash memory or other removable memory module) and memory slot, and other removable storage units 822 and interfaces 820 that allow software and data to be transferred from the removable storage unit 818 to computing system 800.

Computing system 800 can also include a communications interface 324. Communications interface 824 can be used to allow software and data to be transferred between computing system 800 and external devices. Examples of communications interface 824 can include a modem, a network interface (such as an Ethernet or other NIC card), a communications port (such as for example, a universal serial bus (USB) port), a PCMCIA slot and card, etc. Software and data transferred via communications interface 324 are in the form of signals which can be electronic, electromagnetic, and optical or other signals capable of being received by communications interface 824. These signals are provided to communications interface 824 via a channel 828. This channel 828 may carry signals and may be implemented using a wireless medium, wire or cable, fiber optics, or other communications medium. Some examples of a channel include a phone line, a cellular phone link, an RF link, a network interface, a local or wide area network, and other communications channels.

In some further alternative embodiments, part or all of computing system 800 may be operably coupled through a real-time communication network, for example the internet. Therefore, in some cases, the architecture of computing system 800 may be geographically distributed over a network, with the means and ability to run the distributed parts of computing system 800 simultaneously. In some further embodiments, computing system 800 may be operably coupled to one or more further computing systems via a distributed computing network.

In this document, the terms 'computer program product', 'computer-readable medium' and the like may be used generally to refer to media such as, for example, memory 808, storage device 818, or storage unit 822. These and other forms of computer-readable media may store one or more instructions for use by processor 804, to cause the processor to perform specified operations. Such instructions, generally referred to as 'computer program code' (which may be grouped in the form of computer programs or other groupings), when executed, enable the computing system 800 to perform functions of embodiments of the present invention. Note that the code may directly cause the processor to perform specified operations, be compiled to do so, and/or be combined with other software, hardware, and/or firmware elements (e.g., libraries for performing standard functions) to do so.

In an embodiment where the elements are implemented using software, the software may be stored in a computer-readable medium and loaded into computing system 800 using, for example, removable storage drive 822, drive 812 or communications interface 824. The control logic (in this example, software instructions or computer program code), when executed by the processor 804, causes the processor 804 to perform the functions of the invention as described herein.

For example, one example embodiment comprises a non-transitory computer program product comprising executable program code for providing a power supply to a power amplifier, PA, module in a transmitter configured to convert digital signals into radio frequency, RF, signals. The executable program code may be operable for, when executed at a communication unit: configuring sets of multi-level output voltages in a multi-level power supply, MLPS, to be provided to the PA module based on a target PA output power; receiving a variable control signal; applying decimation by sampling the variable control signal and outputting a reduced bandwidth variable control signal; receiving the decimated reduced bandwidth variable control signal at the MLPS; and delivering multi-level output voltages by the MLPS to a supply of the PA module based on at least the decimated reduced bandwidth variable control signal.

Another example embodiment comprises a non-transitory computer program product comprising executable program code for providing a power supply to a power amplifier, PA, module in a transmitter configured to convert digital signals into radio frequency, RF, signals. The executable program code may be operable for, when executed at a communication unit: configuring multi-level output voltages in a multi-level power supply, MLPS, to be provided to the PA module; receiving a variable control signal; receiving quantization threshold adaptation information based on the target PA output power; adaptively changing one or more quantization threshold values in an adaptive quantizer based on the target PA output power; applying the adapted one or more quantization threshold values applied to the received input signal in response to the received quantization threshold adaptation information and generate a quantized variable control signal; and delivering multi-level output voltages by the MLPS to a supply of the PA module based on at least the quantized variable control signal.

Also, software-based examples of this invention are not limited to physical devices or units implemented in non-programmable hardware but can also be applied in programmable devices or units able to perform the desired device functions by operating in accordance with suitable program code, such as workstations, personal computers, notepads, personal digital assistants, electronic games, automotive and other embedded systems, cell phones and various other wireless devices, commonly denoted in this application as 'computer systems'.

In the foregoing specification, the invention has been described with reference to specific examples of embodiments of the invention. It will, however, be evident that various modifications and changes may be made therein without departing from the scope of the invention as set forth in the appended claims.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

However, other modifications, variations and alternatives are also possible. The specifications and drawings are, accordingly, to be regarded in an illustrative rather than in a restrictive sense.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected', or 'operably coupled', to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

For example, in some example embodiments, it is envisaged that the communication unit controller 214 in FIG. 2 and the power controller 390 in FIG. 3, or transmit power controller 580, 680 of FIGS. 5 and 6 may be combined within a single controller. Furthermore, in some example embodiments, although the LUTs 395 have been described individually, thereby suggesting that they may comprise separate memory elements, it is envisaged that a number or each may form a portion of a single LUT or memory element.

Also for example, the various components/modules, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an', as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an'. The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The connections as discussed herein may be any type of connections suitable to transfer signals from or to the respective nodes, units or devices, for example via intermediary components. Accordingly, unless implied or stated otherwise, the connections may for example be direct connections or indirect connections. The connections may be illustrated or described in reference to being a single connection, a plurality of connections, unidirectional connections or bidirectional connections. However, different illustrated examples may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

It will be appreciated that, for clarity purposes, the above description has described embodiments of the invention with reference to different functional units and processors. However, it will be apparent that any suitable distribution of functionality between different functional units or processors, for example with respect to the envelope detector, quantizer, decimator, TPC circuits or components, etc., may be used without detracting from the invention. Hence, references to specific functional units are only to be seen as references to suitable means for providing the described functionality, rather than indicative of a strict logical or physical structure or organization.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individually listed, a plurality of means, elements or method steps may be implemented by, for example, a single unit or processor. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second', etc. do not preclude a plurality.

Thus, more efficient and cost effective solutions to improve PA efficiency, particularly for wider bandwidth applications have been described, wherein the aforementioned disadvantages with prior art arrangements have been substantially alleviated.

We claim:

1. A communication unit comprising:
a decimator configured to sample a variable control signal and output a reduced bandwidth variable control signal;
a multi-level power supply, MLPS, comprising an input and an output, wherein the input is coupled to the decimator and configured to receive the reduced bandwidth variable control signal and, in response thereto, the output delivers multi-level output voltages to supply a power amplifier, PA, module,
a controller operably coupled to the decimator and configured to dynamically select and inform the decimator of at least one decimation factor to be applied by the decimator to adapt the sampling rate applied to the variable control signal, wherein the decimator is configured to dynamically adapt a sampling rate applied to the variable control signal to reduce a control signal bandwidth,
a digital pre-distortion, DPD, circuit configured to receive and distort an input transmit signal, and output the distorted transmit signal; and
an RF transmit circuit configured to amplify and up-convert the distorted transmit signal and apply the amplified, up-converted distorted transmit signal to the PA module; wherein the controller is operably coupled to and arranged to set power levels in the RF transmit circuit and DPD circuit and wherein a portion of the reduced bandwidth variable control signal output from the decimator is input to the DPD circuit such that the DPD circuit distorts the input transmit signal to compensate for PA non-linearity at least partly based on the reduced bandwidth variable control signal.

2. The communication unit of claim 1 wherein the MLPS is configured to select an output supply voltage for the PA module from a plurality of sets of available output voltages based at least partly on the reduced bandwidth variable control signal output from the decimator.

3. A communication unit comprising:
a decimator configured to sample a variable control signal and output a reduced bandwidth variable control signal; and
a multi-level power supply, MLPS, comprising an input and an output, wherein the input is coupled to the decimator and configured to receive the reduced bandwidth variable control signal and, in response thereto, the output delivers multi-level output voltages to supply a power amplifier, PA, module, wherein the decimator is configured to:
sample the received variable control signal using at least one decimation factor, to thereby form a plurality of subsets of samples, and
select a sample from the plurality of subsets of samples of a sample sequence as an output reduced bandwidth variable control signal; wherein a location of the selected sample from the sample sequence is not fixed and is dependent upon one or more other sample values within a decimated subset.

4. The communication unit of claim 3 wherein the decimator is configured to select a maximum sample value from each decimated subset as an output reduced bandwidth variable control signal.

5. The communication unit of claim 3 wherein the decimator is configured to output the reduced bandwidth variable control signal at a 1/DF rate of an input signal.

6. The communication unit of claim 3 wherein a decimation factor is selected based at least partly on an efficiency measurement of the communication unit.

7. The communication unit of claim 1 comprising an envelope detector configured to detect an envelope of a signal to be transmitted by the PA module and output a detected ET signal to the decimator as the variable control signal.

8. The communication unit of claim 7 further comprising a quantizer configured to apply quantization threshold values to the detected ET signal and output a quantized detected ET signal to the decimator.

9. A method for providing a power supply to a power amplifier, PA, module in a transmitter configured to convert digital signals into radio frequency, RF, signals, the method comprising:
configuring multi-level output voltages in a multi-level power supply, MLPS, to be provided to the PA module;
receiving a variable control signal;
applying decimation using at least one decimation factor by sampling the received variable control signal and outputting a reduced bandwidth variable control signal in a form a plurality of subsets of samples;
selecting a sample from the plurality of subsets of samples of a sample sequence as an output reduced bandwidth variable control signal; wherein a location of the selected sample from the sample sequence is not fixed and is dependent upon one or more other sample values within a decimated subset;
receiving the decimated reduced bandwidth variable control signal at the MLPS, and, in response thereto,
delivering multi-level output voltages by the MLPS to a supply of the PA module based on at least the decimated reduced bandwidth variable control signal.

10. A communication unit comprising:
an adaptive quantizer comprising:
an input configured to receive an input signal;
a control input configured to receive quantization threshold adaptation information;
a quantizer configured to adaptively change one or more quantization threshold values applied to the received input signal in response to the received quantization threshold adaptation information and generate a quantized variable control signal; and
an output configured to output the quantized variable control signal; and a multi-level power supply, MLPS, comprising an input and an output, wherein the input is configured to receive the quantized variable control signal and, in response thereto, the output delivers multi-level output voltages to a supply of a PA module.

11. The communication unit of claim 10 wherein the MLPS is configured to select an output supply voltage to be applied to the PA module from a set of available multi-level output voltages based at least partly on the quantized variable control signal output from the adaptive quantizer.

12. The communication unit of claim 10 further comprising a transmit power control, TPC, circuit coupled to the MLPS and the adaptive quantizer and configured to select at least one quantization threshold level to be applied to the input signal based on a target PA output power.

13. The communication unit of claim 12 wherein the TPC circuit is configured to determine required levels of supply voltages to be applied to the PA module by the MLPS and send quantization threshold values to the adaptive quantizer for the adaptive quantizer to apply to the input signal.

14. The communication unit of claim 10 further comprising an envelope detector configured to detect an envelope of a signal to be transmitted by the PA module and output a detected ET signal as the input signal for the adaptive quantizer.

15. The communication unit of claim 14 wherein the adaptive quantizer is configured to quantize the detected ET signal to generate the quantized variable control signal according to a set of quantization threshold levels.

16. The communication unit of claim 10 further comprising a decimator coupled to the output of the adaptive quantizer and an input of the MLPS and configured to sample the quantized variable control signal and output a reduced bandwidth quantized variable control signal to the MLPS.

17. The communication unit of claim 10 further comprising:
a digital pre-distortion, DPD, circuit configured to receive and distort an input transmit signal, and output the distorted transmit signal; and
an RF transmit circuit configured to amplify and up-convert the distorted transmit signal and apply the amplified, up-converted distorted transmit signal to the PA module;
wherein the DPD circuit is configured to distort the input transmit signal to compensate for PA non-linearity, partly based on the quantized variable control signal output from the adaptive quantizer.

18. The communication unit of claim 17 wherein a portion of the quantized variable control signal is output from the adaptive quantizer to the DPD circuit such that the DPD circuit distorts the input transmit signal to compensate for PA non-linearity at least partly based on the quantized variable control signal.

19. The communication unit of claim 12 wherein the quantization threshold is selected based at least partly on: an efficiency measurement of the transmitter, a linearity measurement of the transmitter, a system noise measurement of the transmitter.

20. A method for providing a power supply to a power amplifier, PA, module in a transmitter configured to convert digital signals into radio frequency, RF, signals, the method comprising:
configuring multi-level output voltages in a multi-level power supply, MLPS, to be provided to the PA module;
receiving a variable control signal;
receiving quantization threshold adaptation information;
adaptively changing one or more quantization threshold values in an adaptive quantizer;
applying the adapted one or more quantization threshold values applied to the received input signal in response to the received quantization threshold adaptation information and generate a quantized variable control signal; and
delivering multi-level output voltages by the MLPS to a supply of the PA module based on at least the quantized variable control signal.

21. A communication unit comprising:
a decimator configured to sample a variable control signal and output a reduced bandwidth variable control signal;
a multi-level power supply, MLPS, comprising an input and an output, wherein
the input is coupled to the decimator and configured to receive the reduced bandwidth variable control signal and, in response thereto, the output delivers multi-level output voltages to supply a power amplifier, PA, module,
an envelope detector configured to detect an envelope of a signal to be transmitted by the PA module and output a detected ET signal to the decimator as the variable control signal; and
a quantizer configured to apply quantization threshold values to the detected ET signal and output a quantized detected ET signal to the decimator.

* * * * *